(12) United States Patent
Kim et al.

(10) Patent No.: US 9,108,397 B2
(45) Date of Patent: Aug. 18, 2015

(54) FILM PEELING DEVICE

(71) Applicant: Samsung Diplay Co., Ltd., Yongin, Gyeonggi-Do (KR)

(72) Inventors: Kyu-Bum Kim, Yongin (KR); Jae-Seok Park, Yongin (KR); Jin-Han Park, Yongin (KR); Dong-Sul Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 11 days.

(21) Appl. No.: 13/791,578

(22) Filed: Mar. 8, 2013

(65) Prior Publication Data

US 2014/0076501 A1  Mar. 20, 2014

(30) Foreign Application Priority Data

Sep. 17, 2012 (KR) .................. 10-2012-0102876

(51) Int. Cl.
   *B32B 38/10* (2006.01)
   *B32B 43/00* (2006.01)
   *H01L 51/00* (2006.01)
   *H01L 51/56* (2006.01)

(52) U.S. Cl.
   CPC ............ *B32B 43/006* (2013.01); *H01L 51/003* (2013.01); *B32B 2457/206* (2013.01); *H01L 51/56* (2013.01); *Y10T 156/1132* (2015.01); *Y10T 156/1174* (2015.01); *Y10T 156/19* (2015.01); *Y10T 156/195* (2015.01); *Y10T 156/1956* (2015.01); *Y10T 156/1978* (2015.01)

(58) Field of Classification Search
   CPC B32B 38/10; B32B 43/006; Y10T 156/1132; Y10T 156/1174; Y10T 156/195; Y10T 156/1978
   See application file for complete search history.

(56) References Cited

U.S. PATENT DOCUMENTS

| | | | | |
|---|---|---|---|---|
| 3,654,016 A * | 4/1972 | Alexander | ...................... | 156/247 |
| 4,636,276 A * | 1/1987 | Nozaka | ........................ | 156/353 |
| 4,897,148 A * | 1/1990 | Orlandi | ........................ | 156/750 |
| 5,312,501 A * | 5/1994 | Gruber et al. | ................. | 156/238 |
| 5,478,434 A * | 12/1995 | Kerr et al. | ...................... | 156/760 |
| 5,520,776 A * | 5/1996 | Van Allen et al. | ............ | 156/759 |
| 5,540,809 A * | 7/1996 | Ida et al. | ........................ | 156/760 |
| 5,713,679 A * | 2/1998 | Taylor | ........................... | 400/621 |
| 5,766,349 A * | 6/1998 | Soyama et al. | ............... | 118/120 |
| 6,500,298 B1 * | 12/2002 | Wright et al. | ................. | 156/708 |
| 6,823,920 B2 * | 11/2004 | Gayoso | ........................ | 156/540 |
| 6,974,521 B2 * | 12/2005 | Schermer | ...................... | 156/247 |
| 7,686,916 B2 * | 3/2010 | Tsujimoto et al. | ............ | 156/714 |
| 8,038,824 B2 * | 10/2011 | Kobayashi et al. | ........... | 156/247 |
| 8,052,835 B2 * | 11/2011 | Merrill et al. | ................. | 156/707 |

(Continued)

FOREIGN PATENT DOCUMENTS

| | | |
|---|---|---|
| KR | 10-2004-0021854 | 3/2004 |
| KR | 10-0797572 | 1/2008 |

(Continued)

*Primary Examiner* — Philip Tucker
*Assistant Examiner* — Nickolas Harm
(74) *Attorney, Agent, or Firm* — Christie, Parker & Hale, LLP

(57) ABSTRACT

A film peeling device for peeling a film from a substrate including a transfer module configured to transfer the substrate that is arranged in a vertical direction with respect to a bottom surface of the substrate, and a peeling module configured to peel the film from the substrate transferred by the transfer module.

16 Claims, 11 Drawing Sheets

(56) References Cited

U.S. PATENT DOCUMENTS

| | | | |
|---|---|---|---|
| 8,464,773 B2* | 6/2013 | Hagman | 156/758 |
| 2003/0029562 A1* | 2/2003 | Yotsumoto et al. | 156/344 |
| 2003/0121617 A1* | 7/2003 | Kline et al. | 156/584 |
| 2004/0069401 A1* | 4/2004 | Wurdell et al. | 156/247 |
| 2004/0112534 A1* | 6/2004 | Koizumi et al. | 156/344 |
| 2008/0302480 A1* | 12/2008 | Berger | 156/344 |
| 2009/0032187 A1* | 2/2009 | Hiranaka et al. | 156/344 |
| 2009/0120578 A1* | 5/2009 | Ogawa | 156/344 |
| 2009/0266486 A1* | 10/2009 | Ihara | 156/344 |
| 2009/0288760 A1 | 11/2009 | Garben | |
| 2013/0133835 A1* | 5/2013 | Lee et al. | 156/379.6 |

FOREIGN PATENT DOCUMENTS

| | | |
|---|---|---|
| KR | 10-2008-0074619 | 8/2008 |
| KR | 10-2009-0017529 | 2/2009 |
| KR | 10-2009-0079915 | 7/2009 |

* cited by examiner

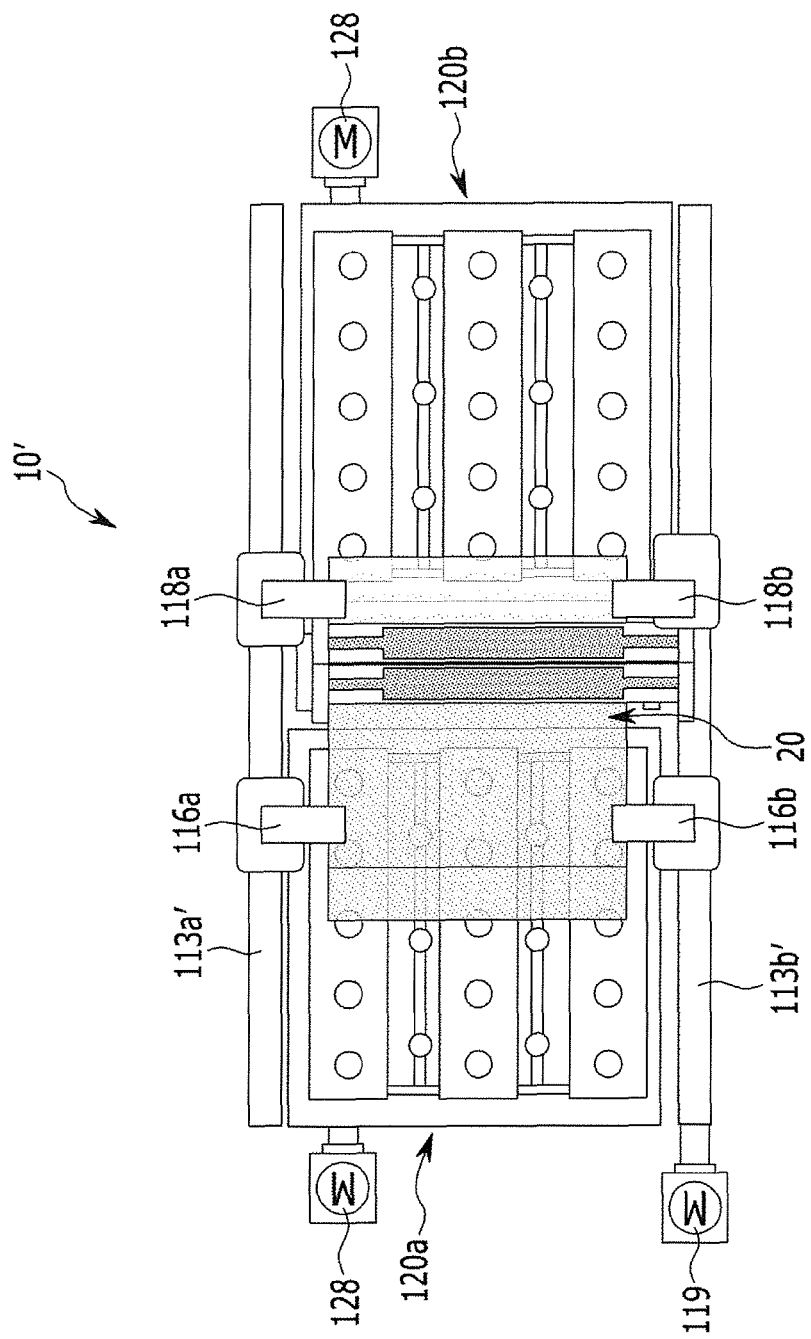

FILM PEELING DEVICE

CROSS-REFERENCE TO RELATED APPLICATION

This application claims priority to and the benefit of Korean Patent Application No. 10-2012-0102876, filed on Sep. 17, 2012 in the Korean Intellectual Property Office, the entire content of which is incorporated herein by reference.

BACKGROUND

1. Field

Aspects of embodiments of the present invention relate to a film peeling device.

2. Description of the Related Art

During a process for manufacturing a display device, such as an organic light emitting diode (OLED) display, a film peeling device for peeling a film provided on a top surface and a bottom surface of a substrate is required so as to protect the substrate, such as a glass substrate on which an organic material is deposited.

Conventionally, the film is peeled while the substrate is disposed horizontally, and as display devices become wider, the substrate droops because of the weight of the substrate when the film of the substrate is peeled while the substrate moves in the horizontal direction, such that the film is not peeled with a uniform thickness.

Also, while the film to which an organic material is provided is peeled, the organic material may fall onto important installed components and pollute or contaminate the environment thereof.

Further, the conventional film peeling device may provide insufficient pressure and force for peeling the substrate of the wide display device, such that uniform peeling rates may not be achieved.

The above information disclosed in this Background section is only for enhancement of understanding of the background of the invention and therefore it may contain information that does not form the prior art that is already known in this country to a person of ordinary skill in the art.

SUMMARY

According to an aspect of embodiments of the present invention, a film peeling device uniformly or substantially uniformly peels a film from a substrate.

According to another aspect of embodiments of the present invention, a film peeling device protects installed components from pollution or contamination by an organic material while a film to which the organic material is transcribed is peeled.

According to an exemplary embodiment of the present invention, a film peeling device for peeling a film from a substrate including a transfer module configured to transfer the substrate that is arranged in a vertical direction with respect to a bottom surface of the substrate, and a peeling module configured to peel the film from the substrate transferred by the transfer module.

The transfer module may include: a front substrate transfer unit at a front side of the peeling module and configured to shift the substrate to the peeling module; and a rear substrate transfer unit at a rear side of the peeling module and configured to shift the substrate peeled by the peeling module.

The front transfer unit and the rear transfer unit may respectively include: an extending guide extended in a substrate transfer direction; a substrate gripper installed on the extending guide, shiftable along the extending guide, and fixable to a side of the substrate; and a first drive motor configured to shift the substrate gripper along the extending guide.

The extending guide, the substrate gripper, and the first drive motor may be arranged as a pair at a top and a bottom of the substrate, respectively.

The extending guides of the front substrate transfer unit and the rear substrate transfer unit may be separated from each other.

The extending guides of the front substrate transfer unit and the rear substrate transfer unit may be integrally formed.

The film peeling device may further include a vacuum chuck module for maintaining the substrate to stand in a vertical direction, wherein the vacuum chuck module includes: a frame; a substrate support including an absorbing hole for providing an air absorbing pressure to the substrate, the substrate support being installed on the frame along the extending guide; and a second drive motor configured to generate power for providing the air absorbing pressure through the absorbing hole.

The peeling module may include a first peeler and a second peeler at respective sides of the transfer module, and the first and second peelers may respectively include: a film gripper fixable to an end of the film; a film gripper guide installed to allow the film gripper to shift; a guide support supporting the film gripper guide; and a third drive motor configured to generate power for shifting the film gripper along the film gripper guide.

The film gripper and the guide support may be extended in a direction that is perpendicular to the substrate transfer direction.

The peeling module may be arranged between the front substrate transfer unit and the rear substrate transfer unit.

The film peeling device may further include a first roller between the front substrate transfer unit and the rear substrate transfer unit and arranged near a side of the substrate shifting along the front substrate transfer unit and the rear substrate transfer unit, and a side roller at a rear side of the first roller with respect to the substrate transfer direction.

The first roller may be a porous peeling roller for absorbing one side of the film, and the side roller may be configured to pressurize both ends of another side of the film.

In one embodiment, while the substrate shifts to the rear substrate transfer unit from the front substrate transfer unit, the film is peeled from the substrate, and the porous peeling roller provides an absorption force for peeling the film from the substrate.

The film peeling device may further include a second roller arranged near another side of the substrate, and a nip roller at a rear side of the second roller with respect to the substrate transfer direction, and pressurized in a direction toward the second roller.

The film may include: a top film attached to one side of the substrate; and a bottom film attached to another side of the substrate, and an organic material layer may be between the top film and the substrate.

According to an aspect of embodiments of the present invention, the film peeling device peels the film while transferring the substrate to which the film is attached in the vertical direction to prevent or substantially prevent non-uniform film peeling caused by drooping of the substrate.

According to another aspect of embodiments of the present invention, the film peeling device prevents or substantially prevents the substrate from being polluted by an organic material when peeling the film that covers the substrate to which the organic material layer is deposited.

In addition, according to another aspect of embodiments of the present invention, the film peeling device peels the film at a uniform or substantially uniform rate and with a uniform or substantially uniform pressure to improve uniformity of the peeled film.

BRIEF DESCRIPTION OF THE DRAWINGS

The above and other features and aspects of the present invention will become more apparent by describing in detail some exemplary embodiments thereof with reference to the attached drawings.

FIG. 11 is a side view of the film peeling device of FIG. 10.

DETAILED DESCRIPTION

Figure 1:
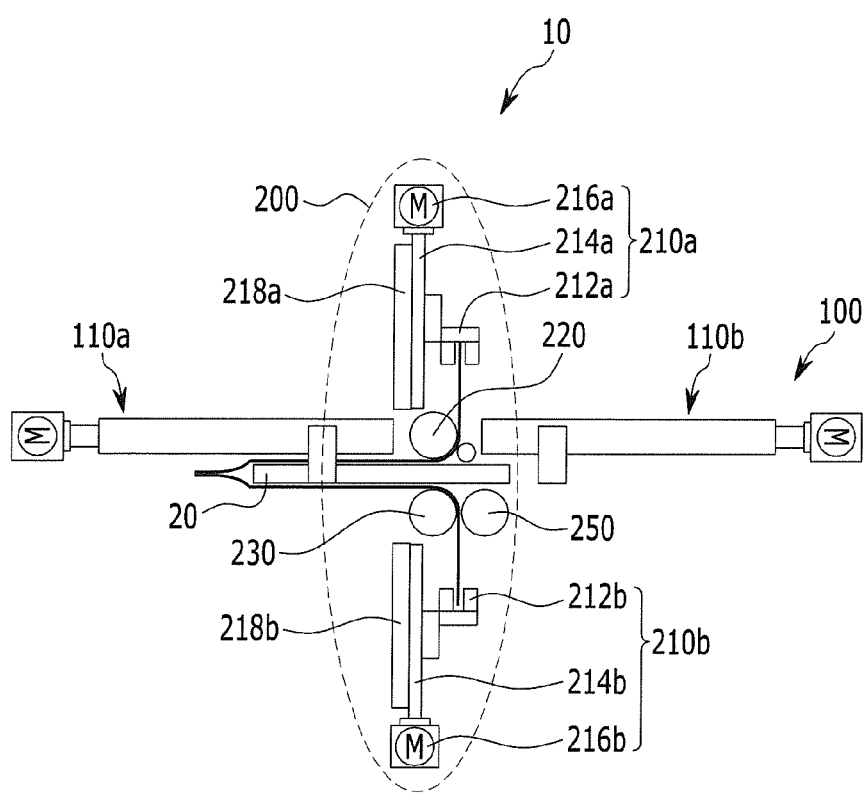
FIG. 1 is a top view of a film peeling device according to an exemplary embodiment of the present invention.

In the following detailed description, certain exemplary embodiments of the present invention are shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Figure 2:
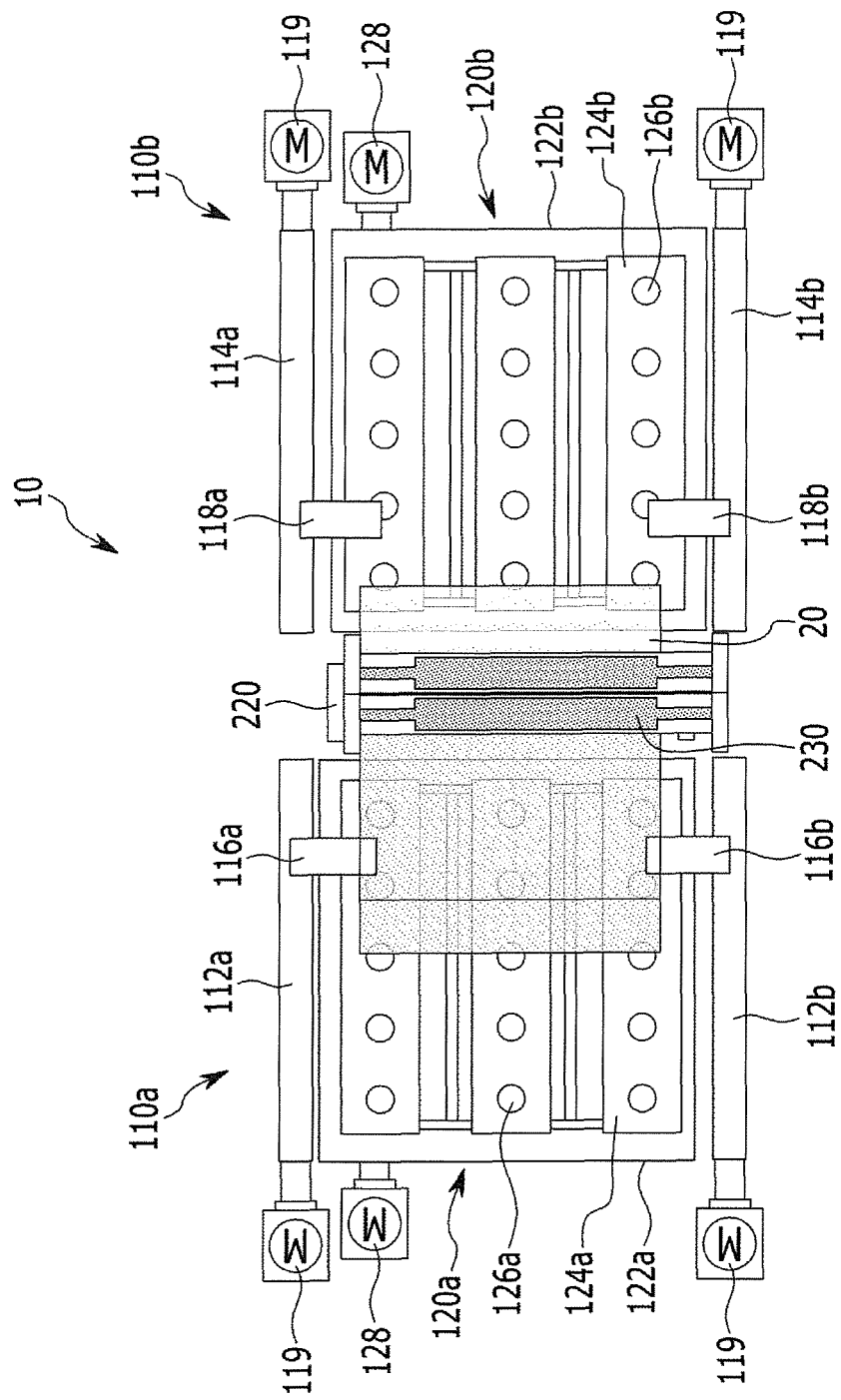
FIG. 2 is a side view of the film peeling device of FIG. 1.
Figure 3:
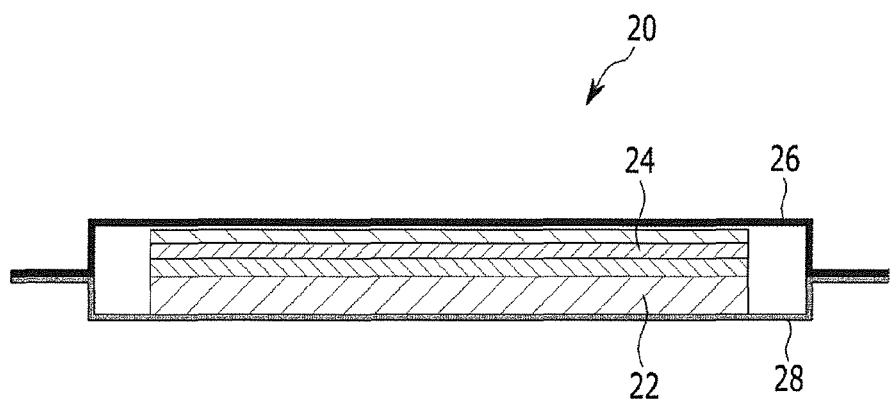
FIG. 3 is a cross-sectional view of a substrate from which a film is peeled by using a film peeling device according to an exemplary embodiment of the present invention.
Figure 4:
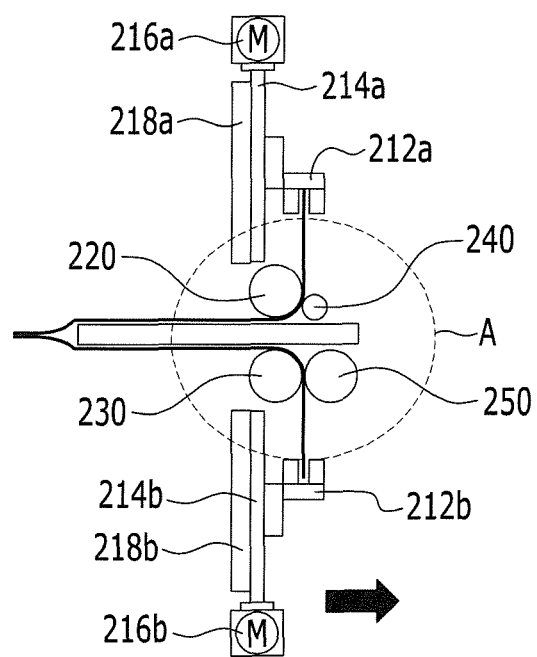
FIG. 4 is a top view of a film peeling device according to an exemplary embodiment of the present invention to peel a film.
Figure 5:
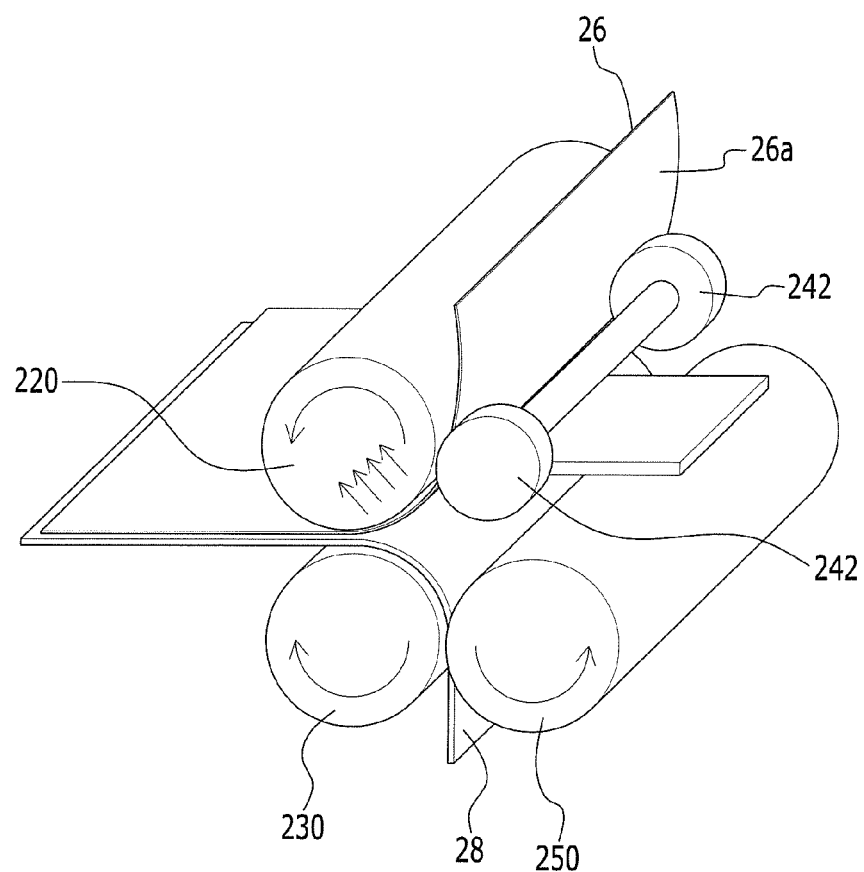
FIG. 5 is an enlarged perspective view of a region "A" of FIG. 4.

FIG. 1 is a top view of a film peeling device according to an exemplary embodiment of the present invention. FIG. 2 is a side view of the film peeling device of FIG. 1. FIG. 3 is a cross-sectional view of a substrate from which a film is peeled by using a film peeling device according to an exemplary embodiment of the present invention. FIG. 4 is a top view of a film peeling device according to an exemplary embodiment of the present invention to peel a film. FIG. 5 is an enlarged perspective view of a region "A" of FIG. 4.

Referring to FIG. 1 and FIG. 2, the film peeling device 10 peels a film from one or more surfaces of a substrate on which the film is attached, and includes a transfer module 100 and a peeling module 200.

In one embodiment, a peeling substance 20 from which the film can be peeled by the film peeling device 10 may be a substrate 22 having respective sides on which a top film 26 and a bottom film 28 are attached, as shown in FIG. 3.

Here, a plurality of deposited organic material layers 24 may be provided between the top film 26 and the substrate 22. The organic material layers may not be deposited between the bottom film 28 and the substrate 22.

The substrate 22 available for peeling the film by the film peeling device 10 may have a size for manufacturing a wide display device; however, the size and type are not restricted by embodiments of the present invention.

In one embodiment, the transfer module 100 of the film peeling device 10 for transferring the substrate 22 includes a front substrate transfer unit 110a and a rear substrate transfer unit 110b.

The front substrate transfer unit 110a is provided at a front side of the peeling module 200 and shifts the substrate to the peeling module 200, and the rear substrate transfer unit 110b is provided at a rear side of the peeling module 200 and shifts the substrate 22 from which the film is peeled by the peeling module 200.

In one embodiment, the front substrate transfer unit 110a includes front extending guides 112a and 112b, front substrate grippers 116a and 116b, and a first drive motor 119, and the rear substrate transfer unit 110b includes rear extending guides 114a and 114b, rear substrate grippers 118a and 118b, and a first drive motor 119.

The front extending guides 112a and 112b and the rear extending guides 114a and 114b are formed with an extended member that is extended in a transfer direction of the substrate 22.

The front substrate grippers 116a and 116b and the rear substrate grippers 118a and 118b are formed on the front extending guides 112a and 112b and the rear extending guides 114a and 114b, respectively, such that they may shift along the front extending guides 112a and 112b and the rear extending guides 114a and 114b.

The front substrate grippers 116a and 116b and the rear substrate grippers 118a and 118b may be formed with a known combining member such that they may be fixed to one side of the substrate 22.

In one embodiment, a single substrate gripper may be provided in the film peeling device 10, or, alternatively, multiple substrate grippers may be provided.

The first drive motor 119 may be combined with the front extending guides 112a and 112b and the rear extending guides 114a and 114b so as to shift the front substrate gripper 116a and 116b and the rear substrate grippers 118a and 118b on the front extending guides 112a and 112b and the rear extending guides 114a and 114b. In this instance, the first drive motor 119 may be a servo motor.

A shift member (not shown) that may be installed in the front extending guides 112a and 112b and the rear extending guides 114a and 114b such that the front substrate grippers 116a and 116b and the rear substrate grippers 118a and 118b may shift along the front extending guides 112a and 112b and the rear extending guides 114a and 114b may be configured with a known shift means such as a ball screw.

In one embodiment, as shown in FIG. 2, the front extending guides 112a and 112b, the rear extending guides 114a and 114b, the front substrate grippers 116a and 116b, the rear substrate grippers 118a and 118b, and the first drive motor 119 of the front substrate transfer unit 110a and the rear substrate transfer unit 110b may be formed as a pair at the top and the bottom of the substrate 22.

The substrate 22 shifts along the front extending guides 112a and 112b and the rear extending guides 114a and 114b while the top and the bottom of the substrate 22 are fixed by the front substrate grippers 116a and 116b and the rear substrate grippers 118a and 118b of the front substrate transfer unit 110a or the rear substrate transfer unit 110b.

In one embodiment, a vacuum chuck module is formed on the front substrate transfer unit 110a and the rear substrate transfer unit 110b, respectively, such that the substrate 22 may continue to vertically stand with respect to the ground while the substrate 22 moves along the front extending guides 112a and 112b and the rear extending guides 114a and 114b.

The vacuum chuck module, in one embodiment, includes a front vacuum chuck 120a and a rear vacuum chuck 120b provided between the front extending guides 112a and 112b and the rear extending guides 114a and 114b of the front substrate transfer unit 110a and the rear substrate transfer unit 110b.

In one embodiment, the front vacuum chuck and the rear vacuum chuck 120a and 120b include frames 122a and 122b, substrate supports 124a and 124b, and a second drive motor 128, respectively.

In one embodiment, the frames 122a and 122b support the substrate supports 124a and 124b and the second drive motor 128, and are combined with the front extending guides 112a and 112b and the rear extending guides 114a and 114b and are then fixed.

The frames 122a and 122b may have a generally square form as shown in FIG. 2, but are not restricted to the square form.

The substrate supports 124a and 124b are formed in the frames 122a and 122b in an elongation direction of the front extending guides 112a and 112b and the rear extending guides 114a and 114b.

The substrate supports 124a and 124b are formed to be disposed near the substrate 22 while the substrate 22 shifts along the front extending guides 112a and 112b and the rear extending guides 114a and 114b.

In one embodiment, a plurality of absorbing holes 126a and 126b are formed in the substrate supports 124a and 124b.

The absorbing holes 126a and 126b generate an air absorbing pressure to the substrate 22 while the substrate 22 shifts along the front extending guides 112a and 112b and the rear extending guides 114a and 114b, such that the substrate 22 may be closely disposed to the substrate supports 124a and 124b, thereby maintaining the substrate 22 to stand in the vertical direction.

The second drive motor 128 for generating power for generating an air absorbing pressure through the absorbing holes 126a and 126b while the substrate 22 is moved is installed on a side of the frames 122a and 122b. In one embodiment, the second drive motor 128 is installed as a pair on opposite sides of the 122a and 122b.

The front substrate transfer unit 110a and the rear substrate transfer unit 110b are formed to separate the front extending guides 112a and 112b and the rear extending guides 114a and 114b.

The peeling module 200 is installed between the front substrate transfer unit 110a and the rear substrate transfer unit 110b.

The peeling module 200 peels the film from the substrate 22 when the transfer module 100 transfers the substrate 22, and the peeling module 200, in one embodiment, includes a first peeler 210a and a second peeler 210b installed at respective sides of the transfer module 100.

In one embodiment, as shown in FIG. 4, the first peeler 210a peels the top film 26 provided at the left side of the direction in which the substrate 22 shifts, and the second peeler 210b peels the bottom film 28 provided at the right side of the direction in which the substrate 22 shifts.

In one embodiment, the first peeler 210a includes a first film gripper 212a, a first film gripper guide 214a, a first guide support 218a, and a third drive motor 216a, and the second peeler 210b includes a second film gripper 212b, a second film gripper guide 214b, a second guide support 218b, and a third drive motor 216b.

Respective constituent elements of the first peeler 210a and the second peeler 210b may be disposed to face each other with respect to the substrate 22.

In one embodiment, the first film gripper 212a and the second film gripper 212b are fixed to ends of the direction in which the film shifts such that the film may be peeled from the substrate 22.

The first film gripper 212a and the second film gripper 212b are formed to shift along the first film gripper guide 214a and the second film gripper guide 214b.

The first film gripper guide 214a and the second film gripper guide 214b may be arranged in the vertical direction with respect to the direction in which the substrate 22 shifts, and may be formed to be supported by the first guide support 218a and the second guide support 218b.

In one embodiment, the first film gripper guide 214a and the second film gripper guide 214b are formed to have lengths that correspond to a width of the film that is peeled from the substrate 22.

The third drive motors 216a and 216b for shifting the first film gripper 212a and the second film gripper 212b are installed at sides of the first film gripper guide 214a and the second film gripper guide 214b, respectively.

The first and second film gripper guides 214a and 214b, and a shift member (not shown) combined with the first and second film gripper guides 214a and 214b for shifting the first and second film grippers 212a and 212b can be configured with a guide device such as a known LM guide.

In one embodiment, the first and second film gripper guides 214a and 214b are vertically arranged with respect to the shift direction of the substrate 22. However, the present invention is not limited thereto, and, in another embodiment, the first and second film gripper guides 214a and 214b may be arranged in any directions in which the film can be peeled from the substrate while the substrate 22 shifts and the first and second film grippers 212a and 212b are combined with the film. Further, the first and second film gripper guides 214a and 214b may have a curved line or roller shape, rather than the straight-line shape as shown in FIG. 1.

Referring to FIG. 4 and FIG. 5, in the film peeling device 10, a first roller 220 and a side roller 240, and a second roller 230 and a nip roller 250, are installed between the front substrate transfer unit 110a and the rear substrate transfer unit 110b and between the first peeler 210a and the second peeler 210b.

The first roller 220 is disposed near a side of the substrate 22 that shifts along the front substrate transfer unit 110a and the rear substrate transfer unit 110b and is formed to contact the side of the substrate 22 while the substrate 22 shifts.

In this instance, the first roller 220 may be a porous peeling roller. Therefore, when the substrate 22 shifts while the top film 26 and the bottom film 28 at the end of the substrate 22 are peeled by the first and second film grippers 212a and 212b, the first roller 220 generates an air absorbing pressure to the top film and rotates such that the top film 26 is peeled by the first roller 220.

In this instance, the first film gripper 212a shifts along the first film gripper guide 214a while combined to one end of the top film 26 such that the top film 26 may be easily peeled from the substrate by the first roller 220.

In one embodiment, the first film gripper 212a does not strongly pull the top film 26 such that a tensile force caused by the film gripper top film 26 may be generated on the top film 26, but the first film gripper 212a guides the top film 26 in a direction that is perpendicular to the substrate transfer direction such that the top film 26 may be easily peeled while unfolded from the substrate 22 by rotation of the first roller 220 that generates an absorption force to the surface of the top film 26.

Further, with respect to the transfer direction of the substrate 22, a rolling unit 242 for pressurizing both ends of a surface 26a of the top film 26 contacting an organic material layer is formed at both ends of a side roller 240 that is disposed at a rear side of the first roller 220, and a center portion thereof is formed to not contact the surface contacting the organic material layer.

Accordingly, an organic material of the organic material layer 24 does not contact the side roller 240 such that the problem in which the organic material falls to important components while the film is peeled to pollute the environment of a device is prevented or substantially prevented.

The second roller 230 and the nip roller 250 are installed opposite the first roller 220 and the side roller 240 with respect to the substrate transfer direction such that the bottom film 28 may be peeled.

The second roller 230 is a peeling roller, its position is fixed, and it is formed to be rotatable.

The nip roller 250 is formed to be movable such that it may be pressurized in the direction of the second roller 230. With respect to the substrate shift direction, while being peeled by the second film gripper 212b, the bottom film 28 at a front end of the substrate 22 is inserted between the second roller 230 and the nip roller 250, and while the substrate 22 moves, the second roller 230 and the nip roller 250 are rotated and the bottom film 28 is peeled from the substrate 22.

In one embodiment, no additional organic material layer is formed between the bottom film 28 and the substrate 22 such that the bottom film 28 may be easily peeled from the substrate 22 by using a pair of rollers such as the second roller 230 and the nip roller 250 that can mutually pressurize the film.

While the bottom film 28 is peeled by the second roller 230 and the nip roller 250, the second film gripper 212b does not provide a strong tensile force to one end of the bottom film 28 but guides shifting of the bottom film 28.

A process for peeling a film from a substrate using a film peeling device according to an exemplary embodiment of the present invention will now be described. FIGS. 6 to 9 show a process for peeling a film by using a film peeling device according to an exemplary embodiment of the present invention.

Figure 6:
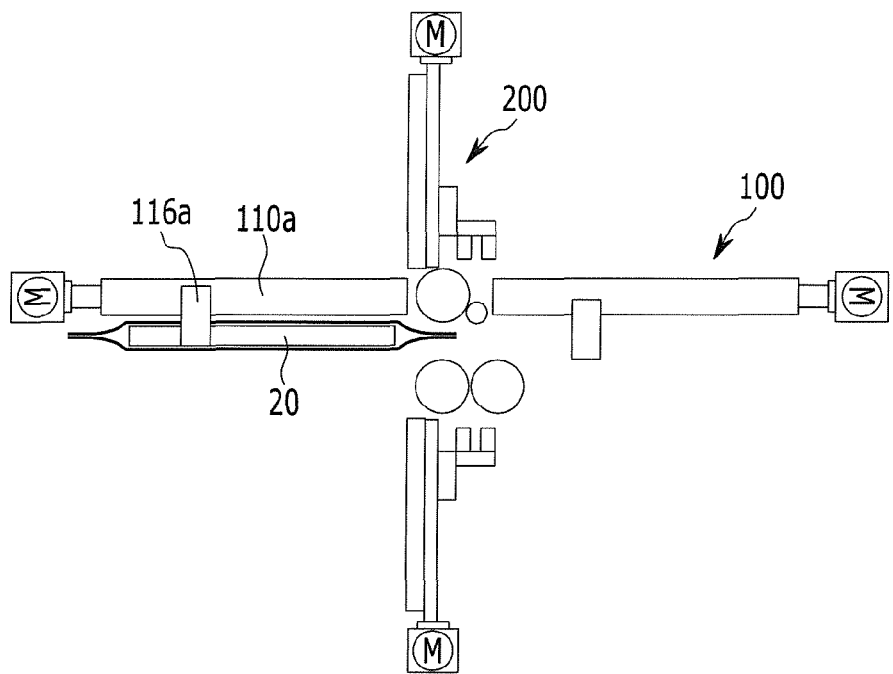
FIG. 6 to FIG. 9 show a process for peeling a film by using a film peeling device according to an exemplary embodiment of the present invention.
Figure 7:
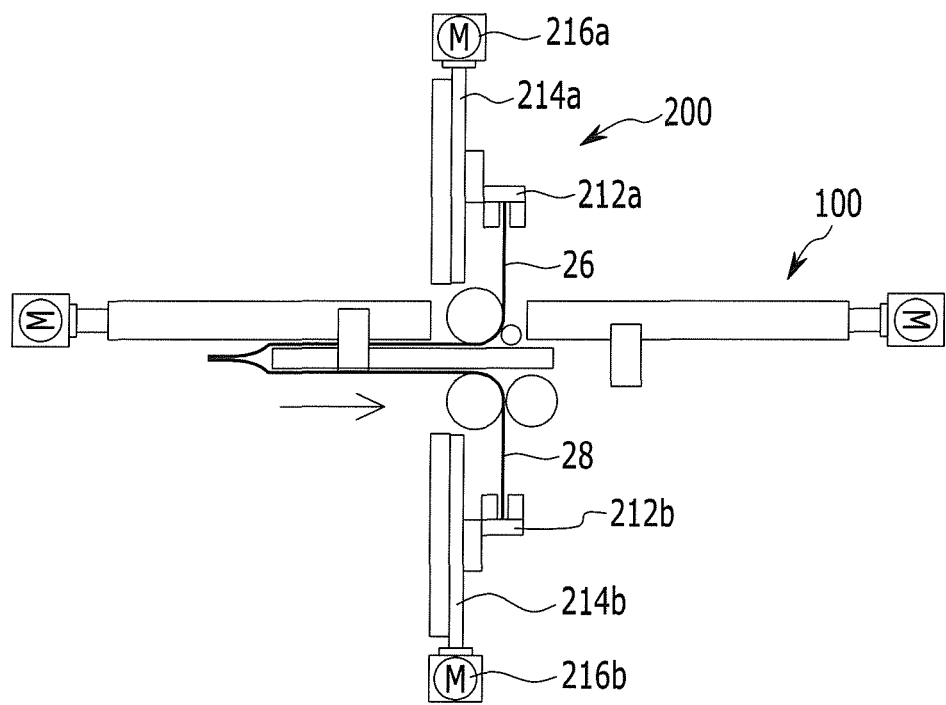
Figure 8:
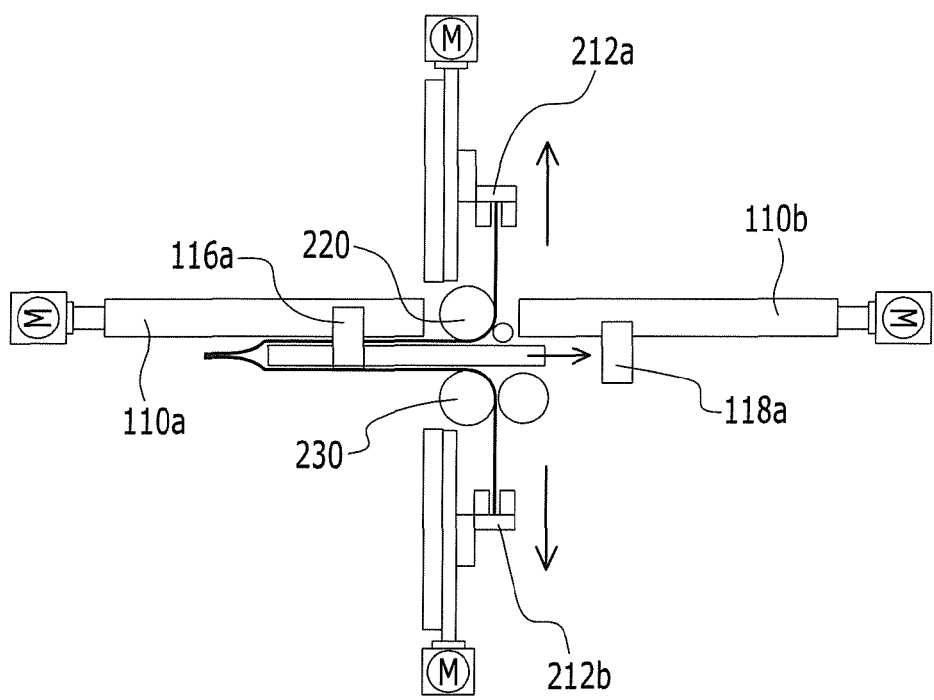
Figure 9:
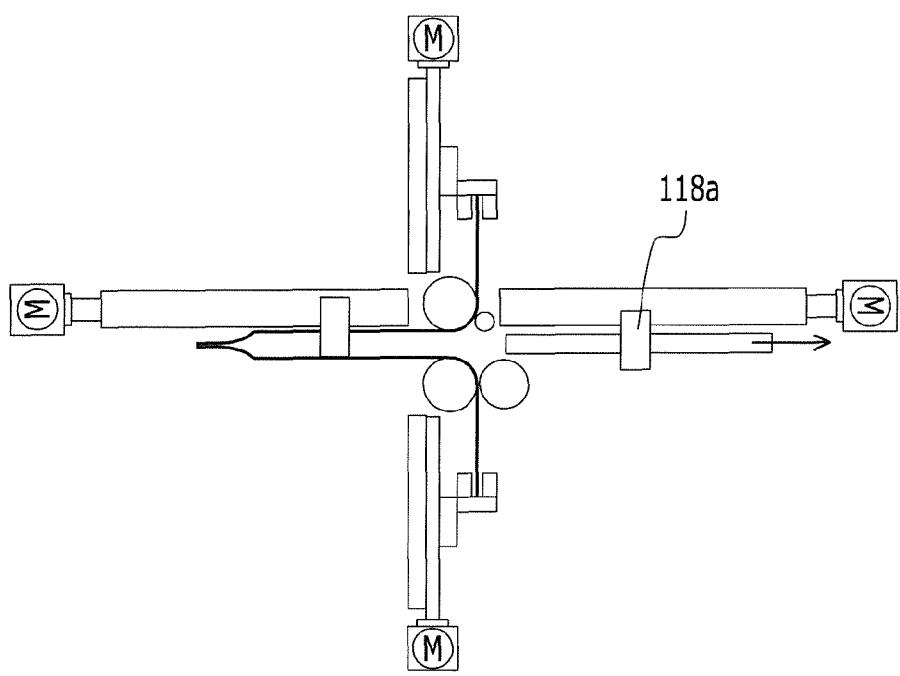

Referring to FIG. 6, the substrate 22 is combined to the front substrate grippers 116a and 116b of the front substrate transfer unit 110a and is shifted in a direction (e.g., the right direction) (hereinafter the substrate transfer direction).

In one embodiment, in the initial stage in which the front substrate transfer unit 110a transfers the substrate 22, the substrate 22 continues to be disposed in the vertical direction because of the air absorbing pressure generated by the front vacuum chuck 120a.

When the substrate 22 is shifted in the substrate transfer direction and the front side of the substrate 22 is passed through the first roller 220 and the second roller 230 with respect to the substrate transfer direction, front ends of the top film 26 and the bottom film 28 installed on the substrate 22 are peeled, and the first and second film grippers 212a and 212b of the first and second peelers 210a and 210b of the peeling module 200 are combined to the front ends of the top film 26 and the bottom film 28.

When the first and second film grippers 212a and 212b are combined to the top film 26 and the bottom film 28, the air absorbing pressure of the front vacuum chuck 120a is removed and the front substrate grippers 116a and 116b are separated from the substrate 22. The substrate 22 is then shifted by the peeling module 200 until the substrate 22 is drawn out.

To peel the top film 26 from the substrate 22, the first roller 220 and side roller 240 are pressurized while the top film 26 is provided between the first roller 220 and the side roller 240.

To peel the bottom film 28 from the substrate 22, the nip roller 250 is pressurized to the second roller 230 while the bottom film 28 is provided between the second roller 230 and the nip roller 250.

The first roller 220 and the second roller 230 are rotated to peel the top film 26 and the bottom film 28 from the substrate 22.

The top film 26 is peeled from the substrate 22 by the absorption force of the first roller 220 when the first roller 220 is rotated. The bottom film 28 is peeled from the substrate 22 by the absorption force when the second roller 230 and the nip roller 250 are rotated.

In one embodiment, the top film 26 and the bottom film 28 are peeled at a constant rate by rotation of the first roller 220, the side roller 240, the second roller 230, and the nip roller 250, and the substrate 22 proceeds in the substrate transfer direction.

The top film 26 and the bottom film 28 are guided in side directions that are perpendicular to the transfer direction of the substrate 22 by the first and second film grippers 212a and 212b of the first peeler 210a and the second peeler 210b, and when the substrate 22 is shifted to the rear substrate transfer unit 110b through the first roller 220 and the second roller 230, the top film 26 and the bottom film 28 are completely peeled from the substrate 22.

At the position where the top film 26 and the bottom film 28 are completely separated from the substrate 22, the rear vacuum chuck 120b of the rear substrate transfer unit 110b is operated to maintain the substrate 22 to stand in the vertical direction.

After the rear substrate grippers 118a and 118b are combined to the substrate 22, the rear substrate grippers 118a and 118b transfer the substrate 22 in the substrate transfer direction along the rear extending guides 114a and 114b to discharge the substrate 22 from which the top film 26 and the bottom film 28 are peeled.

Figure 10:
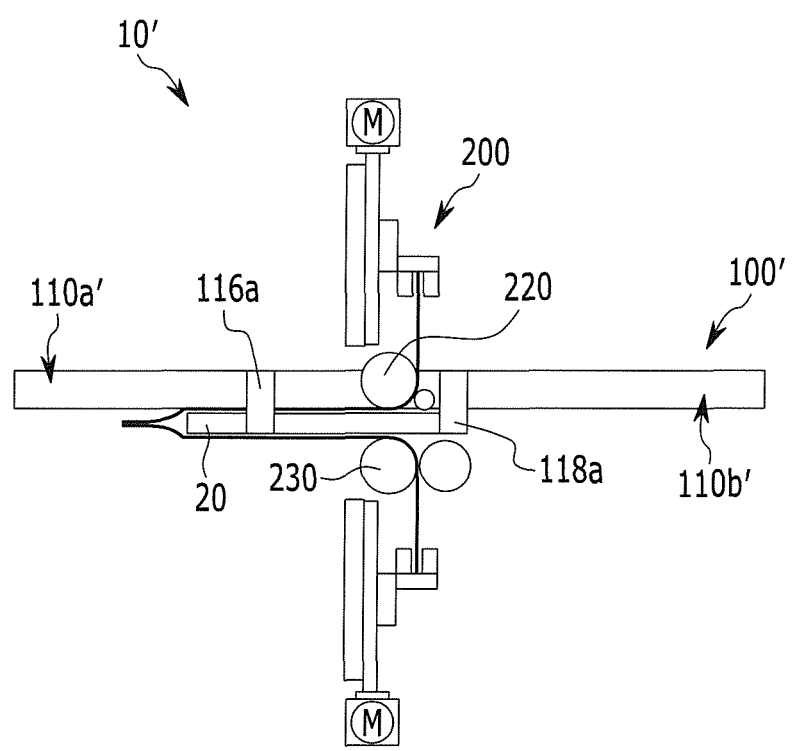
FIG. 10 is a top view of a film peeling device according to another exemplary embodiment of the present invention.

FIG. 10 is a top view of a film peeling device according to another exemplary embodiment of the present invention. FIG. 11 is a side view of the film peeling device of FIG. 10.

A film peeling device according to another exemplary embodiment of the present invention will now be described, and description of components and configuration the same as those of the film peeling device 10 described above will not be repeated.

A film peeling device 10' according to another exemplary embodiment of the present invention includes a transfer module 100' and the peeling module 200.

The film peeling device 10' includes a front substrate transfer unit 110a' and a rear substrate transfer unit 110b' of the transfer module 100', and top and bottom extending guides 113a' and 113b' of the front and rear substrate transfer units 110a' and 110b' that are integrally formed.

The remaining components and configurations of the film peeling device 10' correspond to those of the film peeling device 10 described above, except for the integral formation of the extending guides 113a' and 113b' of the front substrate transfer unit 110a' and the rear substrate transfer unit 110b'.

When the extending guides 113a' and 113b' of the front substrate transfer unit 110a' and the rear substrate transfer unit 110b' are integrally formed according to another exemplary embodiment of the present invention, an inter-axis parallelization degree of the extending guides 113a' and 113b' of the front substrate transfer unit 110a' and the rear substrate transfer unit 110b' may not be dislocated.

Regarding the film peeling device 10 according to the above-described exemplary embodiment, when the front extending guides 112a and 112b and the rear extending guides 114a and 114b of the front substrate transfer unit 110a and the rear substrate transfer unit 110b are arranged in series, a vertical degree of the substrate when the substrate is transferred may be maintained, and when the substrate is erroneously shifted during the substrate shifting process, the film peeling process, and the process for shifting the substrate to the rear substrate transfer unit from the front substrate transfer unit, uniformity of the rate for peeling the film from the substrate may not be guaranteed, and in this case, a strain may occur on the substrate to which the organic material is applied.

Compared to this, when the extending guides 113a' and 113b' are integrally formed in the film peeling device 10' according to another exemplary embodiment, the first drive motor 119 installed on the extending guide 113a' and 113b' can shift the substrate by using a single first drive motor 119, differing from the film peeling device 10, and, for example, efficiency of equipment configuration can be increased by using a linear motor.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A film peeling device for peeling a film from a substrate, the film peeling device comprising:
    a transfer module configured to transfer a substrate that is arranged in a vertical direction from a front side of the transfer module to a rear side of the transfer module in a substrate transfer direction;
    a peeling module configured to peel a film from the substrate transferred by the transfer module; and
    a first roller comprising a porous peeling roller configured to provide an absorption force for peeling the film from the substrate,
    wherein the peeling module comprises:
        a film gripper fixable to an end of the film; and
        a film gripper guide configured to guide the film gripper having the film fixed thereto away from the first roller film along the film gripper guide.

2. The film peeling device of claim 1, wherein the transfer module comprises:
    a front substrate transfer unit at a front side of the peeling module and configured to shift the substrate from the front side of the transfer module to the peeling module; and
    a rear substrate transfer unit at a rear side of the peeling module and configured to shift the substrate peeled by the peeling module from the peeling module to the rear side of the transfer module.

3. The film peeling device of claim 2, wherein each of the front substrate transfer unit and the rear substrate transfer unit comprises;
    an extending guide extended in a substrate transfer direction;
    a substrate gripper installed on the extending guide, shiftable along the extending guide, and fixable to a side of the substrate; and
    a first, drive motor configured to shift the substrate gripper along the extending guide.

4. The film peeling device of claim 3, wherein the extending guide, the substrate gripper, and the first drive motor of each of the front substrate transfer unit and the rear substrate transfer unit are arranged at an upper region of the transfer module, and wherein each of the front substrate transfer unit and the rear substrate transfer unit further comprises another extending guide, another substrate gripper, and another first driver motor arranged at a lower region of the transfer module.

5. The film peeling device of claim 3, wherein the extending guides of the front substrate transfer unit and the rear substrate transfer unit are separated from each other.

6. The film peeling device of claim 3, wherein the extending guides of the front substrate transfer unit are integrally formed with the extending guides of the rear substrate transfer unit.

7. The that peeling device of claim 3, further comprising a vacuum chuck module for maintaining the substrate to stand in the vertical direction, wherein the vacuum chuck module comprises,
    a frame;
    a substrate support including, an absorbing hole for providing an air absorbing pressure to the substrate, the substrate support being installed on the frame along the extending guide; and
    a second drive motor configured to generate power for providing the air absorbing pressure through the absorbing hole.

8. The film peeling device of claim 2, wherein the peeling module comprises a first peeler and a second peeler at respective sides of the transfer module,
    wherein the first peeler is configured to peel the film from the substrate and comprises:
        the film gripper fixable to the end of the film;
        the film gripper guide installed to allow the film gripper to shift along the film gripper guide;
        a guide support supporting the film gripper guide; and
        a peeling module drive motor configured to generate power for shifting the film gripper along the film gripper guide, and
    wherein the second peeler is configured to peel another film from the substrate and comprises:
        another film gripper fixable to an end of the another film;
        another film gripper guide installed to allow the another film gripper to shift along the another film gripper guide;
        another guide support supporting the another film gripper guide; and
        another peeling module drive motor configured to generate power for shifting the another film gripper along the another film gripper guide.

9. The film peeling device of claim 8, wherein the film gripper and the guide support are extended in a direction that is perpendicular to the substrate transfer direction.

10. The film peeling device of claim 8, wherein the peeling module is arranged between the front substrate transfer unit and the rear substrate transfer unit.

11. The film peeling device of claim 10, wherein, the first roller is between the front substrate transfer unit and the rear substrate transfer unit and arranged between the first peeler and the second peeler, and
    wherein the film peeling device further comprises a side roller at a side of the first roller toward the rear side of the transfer module, 12. The film peeling device of claim 11, wherein the first roller is configured to absorb one side of the film, and the side roller is configured to pressurize both ends of another side of the film.

13. The film peeling device of claim 12, wherein, while the substrate shifts to the rear substrate transfer unit from the from substrate transfer unit, the film is peeled from the substrate.

14. The film peeling device of claim 12, further comprising:
- a second roller arranged between the first roller and the second peeler; and
- a nip roller at a side of the second roller toward the rear side of the transfer modulo, and pressurized in a direction toward the second roller.

15. The film peeling device of claim 12, wherein the side roller is configured to not contact a center portion of the another side of the film between the ends when pressurizing both ends.

16. The film peeling device of claim 1,
wherein the film peeling device is configured to peel:
- a top film attached to one side of the substrate; and
- a bottom film attached to another side of the substrate, and wherein an organic material layer is between the top film and the substrate.

* * * * *